United States Patent [19]
Dent

[11] Patent Number: 5,084,669
[45] Date of Patent: Jan. 28, 1992

[54] DIRECT PHASE DIGITIZATION

[75] Inventor: Paul W. Dent, Stehag, Sweden

[73] Assignee: Telefonaktiebolaget L M Ericsson, Stockholm, Sweden

[21] Appl. No.: 490,330

[22] Filed: Mar. 8, 1990

[51] Int. Cl.$^5$ .............................................. G01R 23/10
[52] U.S. Cl. .................................. 324/83 D; 328/134; 307/516
[58] Field of Search ............. 328/133, 134, 155, 141; 324/83 R, 83 D; 307/514, 516

[56] References Cited

U.S. PATENT DOCUMENTS

| | | | |
|---|---|---|---|
| 3,764,903 | 10/1973 | Griswold | 324/83 D |
| 4,001,682 | 1/1977 | Watt | 324/83 D |
| 4,206,414 | 6/1980 | Chapman | 324/83 D |
| 4,310,795 | 1/1982 | Fremerey | 324/83 D |
| 4,341,995 | 7/1982 | Hennick | 328/134 |
| 4,704,574 | 11/1987 | Nossen | 324/83 D |
| 4,733,169 | 3/1988 | Grindahl | 307/516 |
| 4,876,699 | 10/1989 | Nelson | |
| 4,878,231 | 10/1989 | Cok | |
| 4,902,920 | 2/1990 | Wolaver | 328/155 |
| 4,906,941 | 3/1990 | Kato | 328/155 |
| 4,932,036 | 6/1990 | Goradia | 328/155 |
| 4,959,617 | 9/1990 | Martin | 328/155 |

FOREIGN PATENT DOCUMENTS

63-84347 (A) 4/1988 Japan.

Primary Examiner—Kenneth A. Wieder
Assistant Examiner—Jose M. Solis
Attorney, Agent, or Firm—Burns, Doane, Swecker & Mathis

[57] ABSTRACT

An electrical circuit for producing a digital value which is representative of instantaneous phase of an electrical input signal relative to a reference frequency signal. The circuit includes a digital counter for continuously generating a stored count representing a value resulting from dividing the reference frequency signal by a repeating count cycle frequency which is of the same order as an expected center frequency of the electrical input signal. A trigger unit produces a trigger pulse in response to the trigger unit receiving a sampling pulse and a transition edge of the electrical input signal. An intermediate register stores a momentary state of the counter circuit in response to receiving the trigger pulse. The momentary state of the counter circuit corresponds to an instantaneous phase value of the electrical input signal. A correcting circuit is provided for correcting a resulting numerical value in the intermediate register by removing an accumulating phase offset value. An output register is provided for storing the corrected resulting numerical value of the counter circuit.

41 Claims, 5 Drawing Sheets

DIRECT PHASE DIGITIZATION

BACKGROUND OF THE INVENTION

The present invention relates to the detection of the phase and/or frequency of a signal, such as a received radio signal, relative to a known reference signal, as is more particularly concerned with a method and apparatus providing a digital indication of the detected phase or frequency of the received signal.

The instantaneous phase or the instantaneous frequency of an A.C. electrical signal or pulse train is often preferred to be directly available in digital form when subsequent numerical processing is to take place thereon with the aid of microcomputers or digital signal processing chips, for the purpose of, for example, demodulating a phase or frequency modulated radio signal.

Phase and frequency have a close mathematical relationship such that frequency is the time derivative of phase. If a device is available for digitizing phase, a digital representation of frequency can therefore under certain conditions be obtained by numerical differentiation of the phase using modulo 2Pi (circular) arithmetic subtraction. Alternatively, a frequency digitizing device under certain conditions may be used to generate a digital representation of phase by numerical reintegration using modulo 2Pi (circular) arithmetic addition. In both cases, success depends on an accurate mapping of the circular phase domain onto a circular digital domain or Galois field of the same 2Pi period. For example, if an 8-bit binary word is chosen to represent phase, the number range 0 to 256 must exactly match the phase range 0 to 2Pi radians so that the phase wrap-around over 2Pi is exactly represented by the wrap-around of the 8-bit binary word back to 0 upon incrementing 255 by 1.

A conventional method to digitize the phase of an A.C. electrical signal is to apply the signal first to a phase comparator along with a reference signal, the phase comparator thus producing an output voltage or current proportional to the phase difference between its inputs. This analog measure of the signal phase may then be applied to an analog-to-digital converter in order to generate the desired numerical value in the form of a digital code.

The above-mentioned method has certain drawbacks, apart from the need for analog circuit components. If the phase-to-voltage conversion factor of the phase comparator does not exactly match the voltage-to-code conversion factor of the A-to-D converter, an error occurs in the mapping of one circular domain to the other, which can become magnified in subsequent numerical processing such as differentiation.

A similarly conventional method of digitizing frequency by means of an analog frequency discriminator followed by an A-to-D converter suffers from a similar drawback. When the frequency is re-integrated to obtain phase, the results diverge from the true phase due to practical tolerances in the matching of the discriminator to the A-to-D converter.

When the input signal contains a significant amount of noise, there are a limited number of phase comparator circuits with a 2Pi range which function correctly. For example, it is not desirable to use a phase comparator which averages the phase of the signal over many cycles, as, in the region of the 0/360 degrees discontinuity where successive phases may alternate due to noise between just over 0 and just less than 360 degrees, such a circuit can produce completely wrong average result of 180 degrees. In order to solve this problem of averaging a circular quantity such as phase, its instantaneous value is required. Circular averaging may then be employed, which involves taking the sine and cosine of the phase angles, averaging those separately, and then computing the arctangent of the result.

An alternative solution to the modulo 2Pi problem for noisy signals is to use two phase comparators with their reference inputs offset by 90 degrees so that at least one of them lies far from the ambiguous region. A type of phase comparator is often chosen which produces an output voltage proportional to the sine of the phase difference between its inputs, the two quadrature comparator outputs then being a measure of the sine and cosine of phase angle, respectively. These signals are suitable directly for circular averaging. Then, after separate digitization of the averaged sine and cosine signals, the desired phase number may be obtained by a numerical arctangent operation. This so-called I,Q (Inphase and Quadrature) method, is quite complex, as it requires a number of analog components, two A-to-D conversions and a numerical arctangent operation.

A known method to produce a value representing the instantaneous frequency of a signal using purely digital logic elements is the so-called counter-discriminator method. This method entails directly counting the number of zero-crossings (or cycles) of the input signal which occur in a given time. After reading out the previous result, the digital counter is reset to zero and then proceeds again to count zero-crossing events of the input signal for a fixed time to produce the next number.

The problem associated with the counter-discriminator is the long count time needed to determine the frequency with precision. For example, if 1% measurement accuracy is required, the count time must span around 100 zero-crossings of the input signal. The rate at which new frequency measurements can then be generated is limited to around 1/100 of the signal frequency. Moreover, fluctuations of the signal frequency within the measurement period will not be seen.

The drawback associated with the digital counter-discriminator is partly due to the need to limit the timing resolution to whole cycles of the input signal. If fractional cycle resolution could be obtained, a given measurement accuracy can be reached in a shorter time. In digital period measurement, the duration of one or more whole cycles of the signal is measured by counting cycles of a much higher frequency clock, thus providing fractional cycle accuracy. The reciprocal of the period is a measure of the frequency.

In digital period measurement, occurrence of a signal zero-crossing causes the previous count to be read out of the counter before resetting it to zero. It then counts again until the next zero-crossing, at which point the new period measurement is read out, and so on.

The drawbacks associated with digital period measurement are the need for the reciprocal operation, and the fact that the period for which the measurement applies is not regular, but determined by the signal itself. This operation is referred to as natural sampling. It is more often desired to sample and digitize the signal at regular sampling intervals that are not a function of the possibly noisy or varying signal.

SUMMARY OF THE INVENTION

The present invention is directed to an electronic circuit that directly generates, at intervals which may be specified, values which correctly represent in modulo 2Pi format the phase angle of an A.C. signal or pulse train relative to a reference clock signal or pulse train. Furthermore, the phase values generated are suitable for numerical differentiation or other processing using modulo 2Pi arithmetic in order to generate digital representations of instantaneous frequency.

A particular feature of the circuit according to the present invention is that the input signal frequency, reference clock frequency, and phase sampling frequency may be independently chosen, within practical limits, and are not constrained to have particular relationships therebetween. A further feature of the circuit according to the present invention is that the circuit may be configured entirely with digital logic elements.

It is therefore an object of the present invention to provide an electronic device which generates at specified time intervals digital values which represent in modulo 2Pi format the instantaneous phase angle of an AC signal relative to a reference clock signal.

It is a further object of the present invention to provide an electronic device which is capable of performing numerical differentiation of the instantaneous phase angle value produced using modulo 2Pi arithmetic in order to generate digital value representations of instantaneous frequency of the AC signal.

It is another object of the present invention to provide an electronic device which produces the digital value representation of the instantaneous phase angle of the AC signal wherein the input signal frequency, the reference clock frequency, and the phase sampling frequency are independently chosen and are not required to have particular relationships therebetween for utilization by the electronic device in deriving the instantaneous phase angle value.

It is still further an object of the present invention to provide an electronic device which produces digital values of either instantaneous phase or instantaneous frequency of an input AC signal which overcomes the previously mentioned drawbacks of conventional phase/frequency digitization devices.

These and other objects are achieved by the present invention which provides an electrical circuit for determining at specified sampling instances a numerical value which represents as a digital code an instantaneous phase of an electrical signal relative to a reference frequency signal. A counter circuit is provided for continuously generating a stored count representing a value resulting from dividing the reference frequency signal by a repeating count cycle frequency, the count cycle repetition frequency being of the same order as an expected center frequency of the electrical signal. A trigger unit is provided for producing a trigger pulse in response to the trigger unit receiving a sampling pulse at an arming input and a transition of the electrical signal at a firing input. An intermediate register stores a momentary state of the counter circuit in response to the intermediate register receiving the trigger pulse. The momentary state of the counter circuit corresponds to an instantaneous phase value of the electrical signal. A correcting circuit is provided for correcting a resulting numerical value in the intermediate register by removing an accumulating phase offset value, the phase offset value being a product of a predetermined time period between sampling pulses and a predetermined frequency between the count cycle repetition frequency and the expected center frequency of the electrical signal. An output register is provided for storing the corrected resulting numerical value of the counter circuit which is transferred from the intermediate register in response to the occurrence of the next sampling pulse, which also effects a storage of the next momentary state of the counter circuit in the intermediate register.

DETAILED DESCRIPTION OF THE PREFERRED EMBODIMENTS

Figure 1:
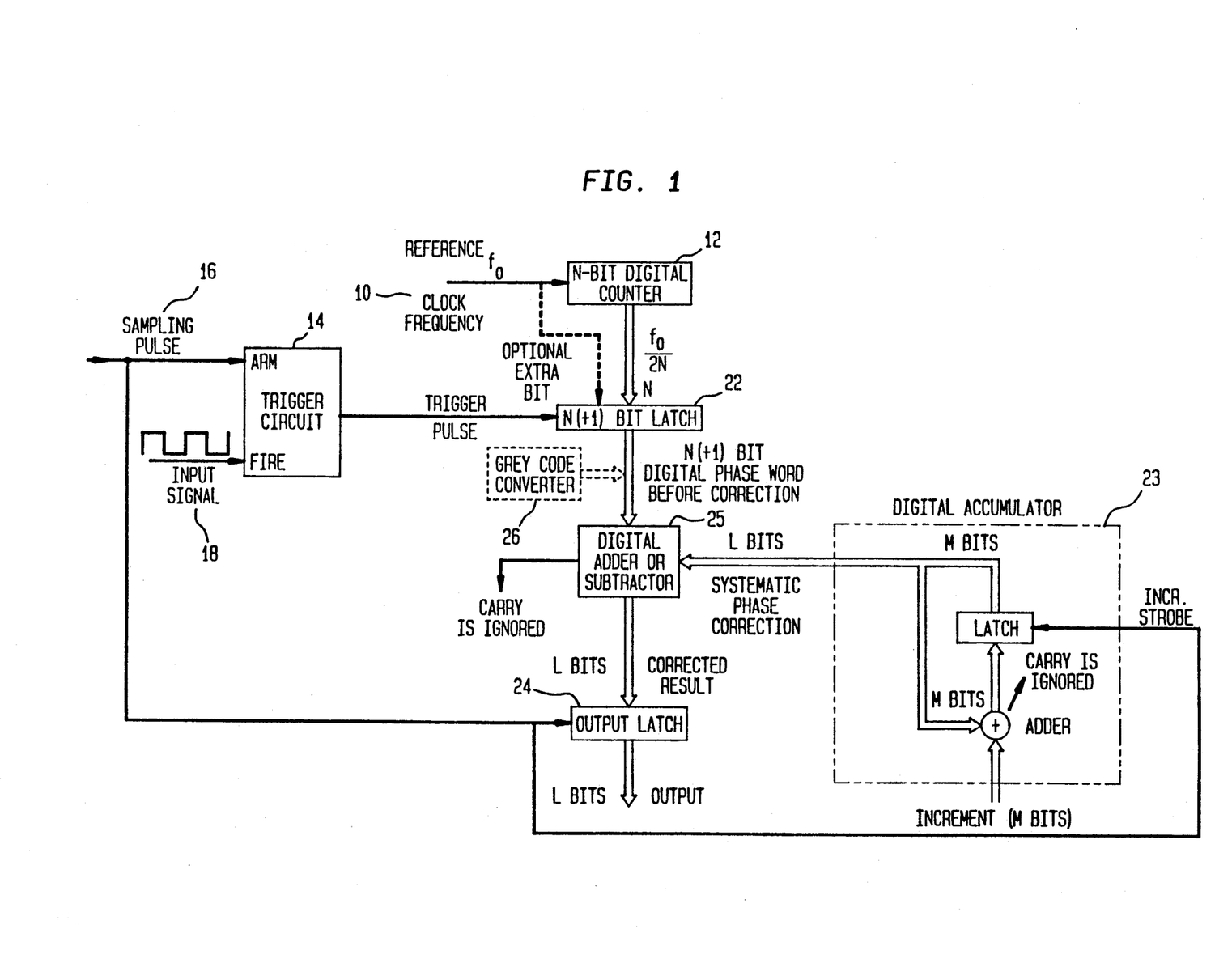
FIG. 1 illustrates a block diagram of the digitization circuit according to the present invention.

Referring now to FIG. 1, a simplified block diagram a circuit which implements the principles of the present invention is shown. A reference clock frequency 10 is generated which is an integer multiple, preferably binary, of the expected signal frequency. The reference clock frequency 10 is applied to a digital counter 12 which divides the reference clock frequency by this integer multiple to produce a divider count cycle which repeats at the same rate as the expected signal frequency. An output value is produced by recording the state of the counter 12 at zero-crossing events of the input signal. In contrast to the above-mentioned known methods, the digital counter 12 is not periodically reset and continues to increment between measurements. Moreover, recording of the counter state is caused by a trigger circuit 14 which is initiated in response to the occurrence of two events.

The trigger circuit 14 must first be armed by receipt of a sampling pulse 16 which indicates that a measurement is to be made. Once armed, the trigger circuit 14 is fired by the occurrence of the next zero-crossing of the input signal 18. The output trigger pulse 20 produced by the trigger circuit 14 when it is fired causes the state of the counter 12 at that instant to be transferred to an intermediate holding register or latch 22. As an optional embodiment, an extra bit of timing precision may be obtained by extending the latch by one bit and recording also whether the reference clock frequency 10 at the trigger instant was on a negative or positive half cycle. Optionally this addition may be improved to extend the timing accuracy by more than one bit by using a reference signal waveform having more than just two possible voltage states, for example a sawtooth or other analog waveform, and quantizing its state to a much higher accuracy than one bit by such means as an A-to-D converter.

The contents of the intermediate latch 22 are held until the next sampling pulse 16 is applied to arm the trigger circuit 14, at which point the contents are transferred to a digital adder/subtractor 25 and subsequently to an output register or latch 24 before they become replaced by the next measurement. Measurements thus appear in the output register 24 with a one-sample delay, and at a regular rate determined by the externally applied sampling pulse 16.

If the expected signal frequency is exactly equal to the division cycle repetition frequency of counter 12, zero crossings will always occur at the same reference counter state, which in turn depends on the arbitrary phase of the signal relative to the reference clock frequency 10. For example, assuming the counter 12 divides by 64, the sequence of numbers produced by the counter 12 may be 29, 29, 29 . . .

If the expected signal frequency is lower than that of the division cycle repetition frequency, then zero crossings will occur progressively later at each sampling event, for example, 29, 32, 35, 38 . . . 62, 1, 4, 7 . . . , the counter wrapping around at the value of 63.

The exact expected increment per sample is, in this example, equal to 64 times the frequency offset multiplied by the time between samples. For example, if the expected nominal signal frequency is 1000 Hz lower than the reference counter repetition frequency, and the sampling rate is 256 Hz, then the expected increment between samples will be 1000/256 = 3 29/32nds.

When the input signal nominal center frequency is equal to the repetition period of the N-bit digital reference counter, i.e. equal to $f_0$ divided by $2^N$, assuming the counter is pure binary, then successive phase measurements will give the same value. In practice a reference clock having an output frequency exactly $2^N$ times the expected nominal input signal frequency is often not readily available, therefore it is desired to use instead the nearest available frequency. This error is fixed and known, so one can predict in advance that the resulting phase measurements will be in error by an amount which progressively increases between successive samples.

For example, if the difference between the reference frequency divided by $2^N$ (the reference divider repetition counter cycle) and the nominal input signal frequency is 100 cycles per second, the phase measurements would change at the rate of 100 times 2Pi per second even with an exact central input frequency. If the sampling rate is 1000 per second, the phase error is thus increasing at the rate 100*2Pi/1000 = Pi/5 between each sample. This progressively increasing, but totally predictable error can be removed by the circuit shown in FIG. 1.

The above example wherein the counter 12 wraps around the value of 63 has been chosen where the expected increment 3 29/32nds is not an integer in order to illustrate that the cumulative increment can nevertheless still be predicted by extending the precision to the right of an imagined decimal point to represent the fractional part. In the above example, a binary accumulator 23 having six bits to the left of the decimal point plus five bits to the right of the decimal point may be used to represent numbers in steps of 1/32nd. The accumulator would be incremented after every sample by the digital code:

000011.11101 representing 3 29/32nds.

The digital accumulator 23 is incremented after every sample pulse by the known systematic phase error increase per sample period. i.e. Pi/5 in the above example, so it rotates progressively through the values Pi/5, 2Pi/5, 3Pi/5, 4Pi/5, 0 (the carry is ignored), Pi/5, etc. The value in the accumulator 23 is then subtracted from the phase measurement by a digital adder/subtractor to produce a corrected result which again would be a constant value on successive sample pulses for an exact, nominal input frequency. The mean rotation due to the systematic frequency deviation of the reference clock frequency 10 from an exact relationship with the input signal center frequency is thereby removed.

It can be appreciated that the word length in bits of the accumulator 23 can be as large as necessary to represent fractional frequency errors to as high a precision as desired. The accumulator 23 can have more bits of precision than the N or N+1 bit phase measurement recorded in the intermediate latch 22. In principle, only the most significant N or N+1 bits of the accumulator 23 would then be used in the digital adder/subtractor 25 to effect the correction, however, to reduce the small extra error associated with truncating the accumulator value used, it can be advantageous to use one or two extra bits over and above N (or N+1) with the result that the precision of the output value from the adder/subtractor 25 is extended to L bits in length, where L is slightly more than N (or N+1) e.g. N+2 bits. In the case where the systematic frequency error can be exactly represented by an accumulator increment of no greater precision than N or N+1 bits, then it is not necessary to extend the accumulator or the adder/subtractor word length.

The value in the accumulator 23 represents the systematic phase offset a signal at exactly the specified nominal center frequency would have accumulated up to this point due to systematic frequency offset from the reference. The increment to the accumulator 23 represents the extra phase rotation that is added every sampling cycle due to the systematic frequency offset integrated over the sampling interval. By subtracting the accumulated phase offset from the phase measurement before transferring the result to the output register 24, it is corrected both for systematic frequency error and for the non-commensurate sampling rate. It therefore becomes possible to choose the signal center frequency, reference frequency and sampling rate independently of each other, within reasonable practical limits. It is further possible to have a variable period between samples, providing the irregularity is systematic and known, so that the systematic phase error component can be predicted and subtracted out.

The digital counter 12 of FIG. 1 is preferably one utilizing " Grey Code". A Grey code count sequence is one in which only one digit of a multi-digit counter changes between each count. For example, the decimal sequence—0,1,2,3,4,5,6,7,8, 9,19,18,17,16,15,14,13,12,11,10,20,21,22,23—is Grey coded. In binary, the difference between Grey code and normal binary is exemplified as follows:

|   | Normal Binary | Grey Coded Binary |
|---|---|---|
| 0 | 0000 | 0000 |
| 1 | 0001 | 0001 |
| 2 | 0010 | 0011 |
| 3 | 0011 | 0010 |
| 4 | 0100 | 0110 |
| 5 | 0101 | 0111 |
| 6 | 0110 | 0101 |
| 7 | 0111 | 0100 |
| 8 | 1000 | 1100 |
| 9 | 1001 | 1101 |

-continued

|    | Normal Binary | Grey Coded Binary |
|----|---------------|-------------------|
| 10 | 1010          | 1111              |
| 11 | 1011          | 1110              |
| 12 | 1100          | 1010              |
| 13 | 1101          | 1011              |
| 14 | 1110          | 1001              |
| 15 | 1111          | 1000              |

With normal binary coding, if the trigger pulse occurs exactly at the instant the counter 12 is incrementing, several digits can be changed at once, e.g. the transition from 0111 (7) to 1000 (8). There is the danger that the bits change at finite and slightly different speeds. This transition may cause a false value to be latched in which some of the bits have been changed and others have not. For example, in the transition from 0111 (7) to 1000 (8), if the most significant bit changes slightly faster than the remaining bits, the erroneous state 1111 (15) could possibly be latched. By using Grey coding, however, only one bit changes at a time. Therefore, the only two alternatives that can be latched if the trigger pulse occurs at the time the counter 12 is changing are the previous value and the new value, either of which is equally viable. When a Grey coded counter sequence is used, a Grey-to-binary conversion is needed to facilitate the performance of subsequent arithmetic such as addition/subtraction on the phase value. Therefore, it is convenient to utilize a Grey-to-binary converter 26 at a point between the intermediate latch 22 and the output latch 25.

Figure 2:
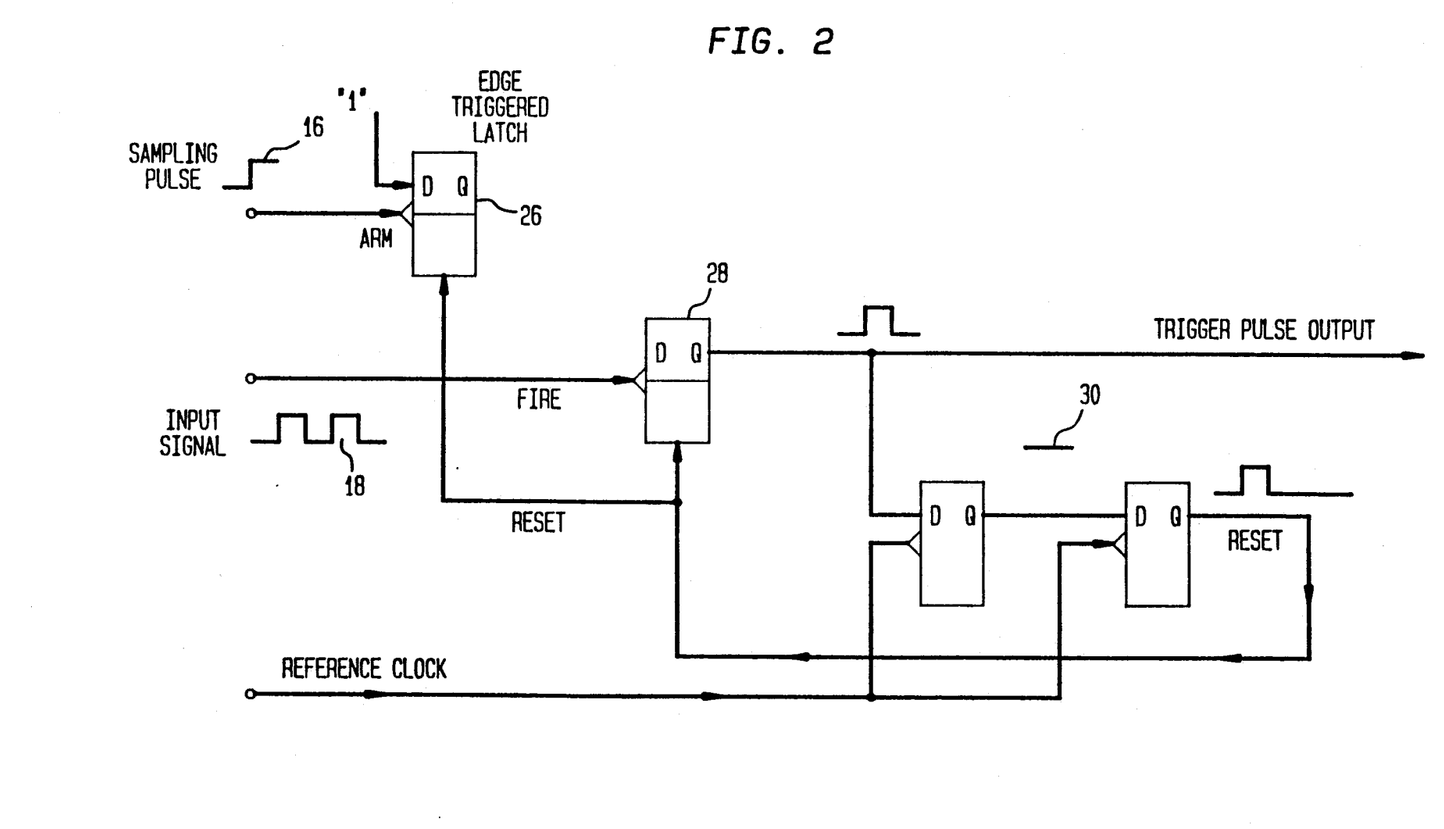
FIG. 2 illustrates a preferred embodiment of the trigger circuit according to the present invention.

The trigger circuit 14 required in FIG. 1 may be implemented according to the logic diagram illustrated in FIG. 2. Referring thereto, a first edge-triggered (D-type) latch 26 has the sampling pulse source 16 connected to its clock input, and a permanent '1' level on its data input. Upon occurrence of the sampling pulse edge, the data '1' level will be transferred to the Q output, which is further connected to the data input of a second edge-triggered latch 28. The clock input of latch 28 is driven by the input signal 18. Thus, upon occurrence of the next edge or zero-crossing of the input signal 18 after the trigger circuit 14 has been armed, a '1' level will appear on the Q output of the fire latch 28. This output is the trigger pulse output to the intermediate latch 22 required in FIG. 1.

When the trigger circuit 14 has fired, the trigger circuit 14 is required to be returned to its initial state by means of a suitable reset pulse. This may, for example, be produced by delaying the trigger pulse from the Q output of the fire latch 28 through two shift registers 30 which are clocked at the high reference clock frequency 10 to produce a reset pulse to both the arming latch 26 and fire latch 28. Since the trigger pulse from the fire latch 28 has no special time relationship with the reference clock frequency 10, it can occur shortly before a reference clock edge resulting in little or no delay in it appearing out of the first shift register delay stage. Two shift register delay stages are therefore utilized to guarantee that the output trigger pulse and reset pulse are at least one reference clock cycle long and do not occasionally become vanishingly short.

A number of possible further embodiments of the present invention may be implemented. A previously mentioned alternate embodiment consists in obtaining one or more extra bits for precision in the phase measurement by recording in the intermediate holding latch 22 not only the counter 12 state at the instant the trigger pulse occurs, but also the state of the reference clock waveform at the trigger instant. In the simplest implementation of this embodiment, there need only be the high/low state of a square wave clock waveform which is recorded to provide an extra bit of resolution. For further increasing resolution, a waveform having more than two voltage states, such as a staircase or continuous ramp (sawtooth wave) can be used, together with a device to discriminate between the different states for example, a suitable A-to-D converter.

It can further be advantageous to use both positive and negative going edges or zero-crossings of the input signal. One advantage may be gained by allowing the trigger circuit 14, after being armed, to be fired by edges of either polarity, whichever arrives first, the advantage being that it is the edge nearest in time to the desired sampling instant which is phase-quantized. In this case, it is also necessary to record which polarity fired the trigger, and to correct the phase value obtained by 0 or 180 degrees accordingly, for example, by inverting the most significant bit (MSB).

Figure 3:
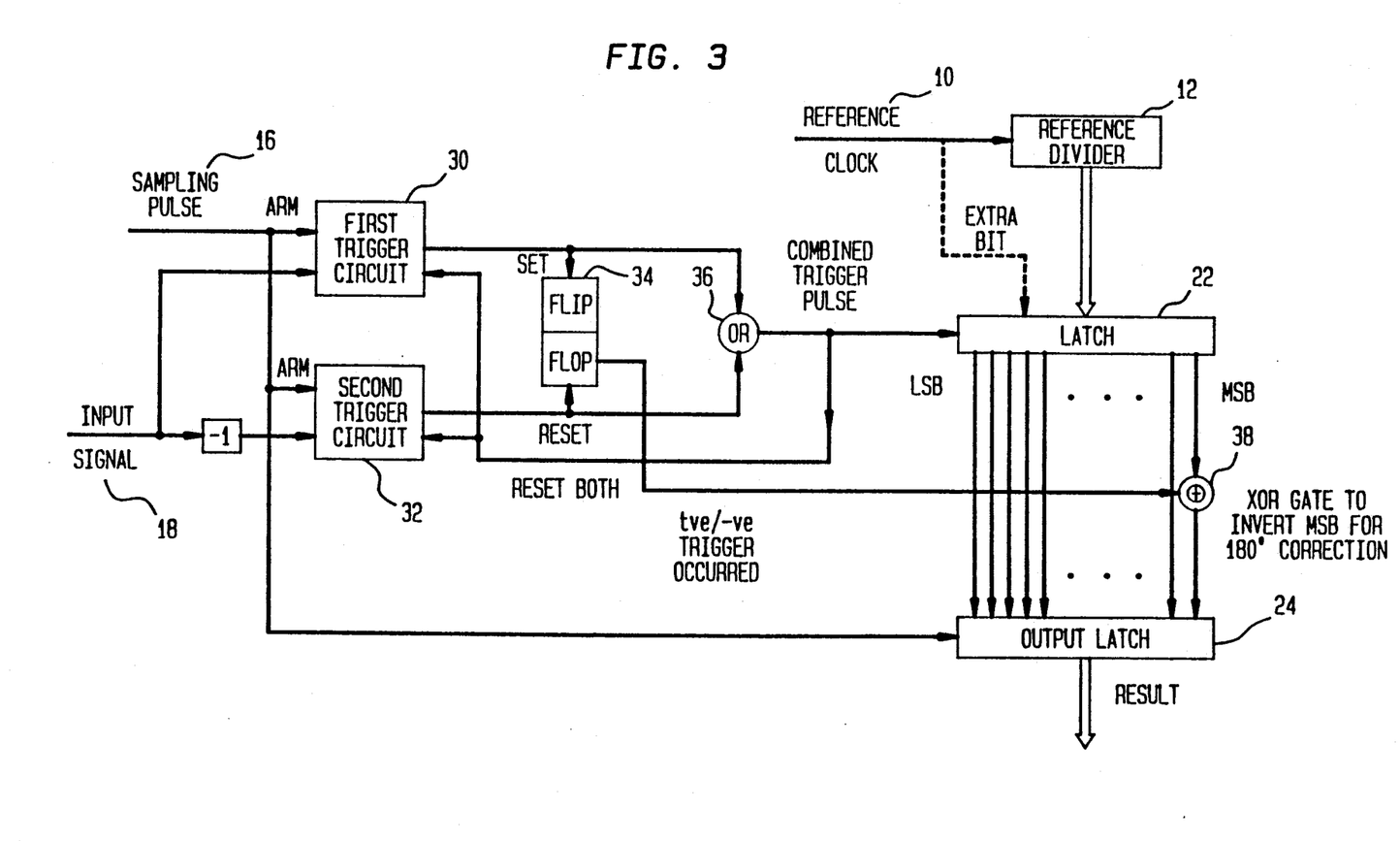
FIG. 3 illustrates a block diagram of a further embodiment of the digitization circuit according to the present invention.

FIG. 3 illustrates one configuration of the present invention using both edges of the input signal to trigger the digitization. The occurrence of a sampling pulse 16 simultaneously arms two distinct trigger circuits 30, 32 that may then be fired upon the occurrence of, respectively, a positive going or negative going transition of the input signal 18.

The output trigger lines are logically ORed by OR gate 36 so that the occurrence of either trigger effects latching of the reference counter state into the first latch 22. Moreover, the occurrence of this event resets both trigger circuits 30, 32 so that a new sampling pulse 16 is needed before they again can be fired. This operation guarantees that only the first to be fired after arming will be fired. A set/reset flip-flop 34 records which of the two trigger circuits 30, 32 is fired.

Assuming that it is the positive going transitions of the input signal which defines phase, and that negative going transitions occur nominally mid-way between (180 degrees), then it is necessary to correct the phase measurement by 180 degrees if the measurement was made on the negative going signal edge. This correction is done by inverting the most significant bit of the phase measurement by way of an XOR gate 38 by EXCLUSIVE ORing the flip-flop 34 state with the MSB (which represents 0 or 180 degrees) if a negative transition fired the joint trigger before latching the result in the output latch 24 at the next occurrence of a sampling pulse.

A slight advantage in phase resolution or accuracy may be obtained by using two separate trigger circuits triggered respectively by the negative and positive going flanks of the input signal, and to record the counter state separately in two distinct latches. The two results may then be combined to result in a phase word having one bit of extra length. The combination of the two results may be performed for example as follows:

PHASE = MOD2n(2*A + MODn(B − A))

where A is the content of the latch triggered by zero-crossings of one polarity (measured modulo n, probably a power of two) and B is a similar value from the latch triggered by zero-crossings of the other polarity.

The difference B-A calculated modulo n is added to twice the value of A (A left-shifted one bit). The result reduced modulo 2n gives a phase representation of one bit greater word length.

Furthermore, by arranging that no strobe is produced to the output latch 24 unless the trigger circuit 14 was fired in the last sampling period, the previous value may be held in the case that the input signal was anomalous or too weak to provide a better estimate. Higher order holding algorithms may also be implemented either by computing numerical derivatives within the phase digitizing circuit, or in subsequent numerical processing. In the latter case, a flag bit would be generated from the circuit to indicate whether a trigger pulse had occurred or not during the last sampling period.

In addition, an alternate embodiment of the present invention includes an arithmetic unit which receives the corrected digital value stored in the output latch 24 in order to generate a digital code which represents an instantaneous frequency value of the input signal. The unit is operable for subtraction of two successive instantaneous phase values using modulo 2Pi arithmetic, which in effect is equivalent to a differentiation of the instantaneous phase value.

As the phase of the input signal 18 relative to the available frequency reference 10 and/or the sampling clock pulse 16 is arbitrary, the actual occurrence of a zero-crossing of the input signal 18 may be offset in time from the desired sampling instant by up to nominally one cycle of the frequency of input signal 18, in the event that zero-crossings of only one polarity are used, or up to nominally half a cycle in the event that both polarities are used. This sampling timing error in turn gives rise to an error in the phase measurement equal to the extra phase rotation of the input signal 18, due to its frequency difference from the reference clock frequency 10, multiplied by the extra time. If the resulting 0−1 cycle or 0−½ cycle time jitter is small compared to the sampling period and the frequency offset of the signal is small relative to the reference clock frequency 10, this extra error is proportional to the product of two small quantities and therefore may be neglected. If, however, either quantity is significant, such as when the system is designed to operate with a larger systematic offset between the input signal nominal frequency and the reference clock frequency, or when the sampling rate is a significant fraction of the input signal frequency, or both, it can become necessary to perform an explicit correction to remove this form of error.

The required correction is the product of the amount of time dT occurring earlier or later than the desired sampling instant at which the trigger is fired, expressed as a fraction of the total sampling T, with the expected phase offset dF of the signal over the entire sampling period. This correction is expressed in the following equation:

Extra Correction = dF*dT/T

As an example, the situation when the desired sampling instances are coincident with the reference counter value being 0 will now be described. In this case, dT is given by the phase value latched in the intermediate latch 22. Otherwise, dT would be given by the intermediate latch value minus the value of the digital counter 12 at the occurrence of the sampling pulse 16. The phase offset dF of the signal relative to the reference that occurs during a sampling period is proportional to the frequency offset. It may be sufficient to use only the fixed nominal value of the expected systematic frequency offset. Alternatively, in the case of an input signal whose frequency varies over a wide range, it may be necessary to use an estimate of the instantaneous frequency. In an embodiment in which the present invention is utilized for frequency determination by numerical differentiation of the phase measurement, such an estimate will already be available. A block diagram of an embodiment of the present invention illustrating such a method of applying the non-linear correction is illustrated in FIG. 4.

Figure 4:
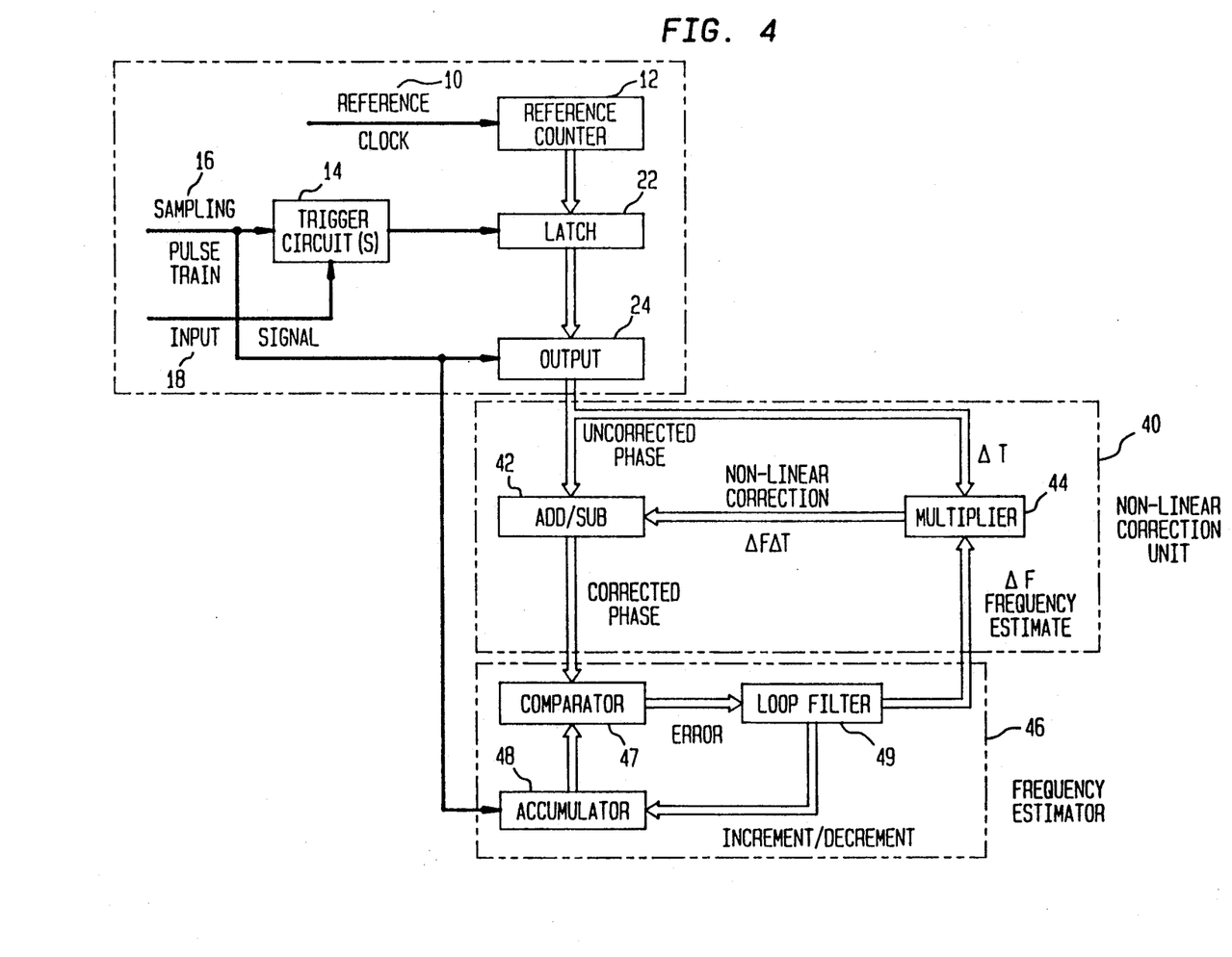
FIG. 4 illustrates a block diagram of the digitization circuit according to the present invention including a non-linear correction unit and a frequency estimator.

With respect to the embodiment using the non-linear correction of FIG. 4, an optional non-linear correction unit 40 may be regarded as a supplemental component to the digital accumulator utilized in the embodiment of FIG. 1. It should be noted, however, that it is not necessary to use the digital accumulator technique in order to apply the non-linear correction unit 40. The digital accumulator 23 of FIG. 1 calculates a systematically increasing (rotating) phase value corresponding to the difference in frequency between the expected signal and the reference counter value. This value is then subtracted from the measured phase to obtain a corrected phase value which is approximately equal to the value that would have been obtained if the reference counter 12 had a period equal to that of the nominal signal.

The aforementioned correction suffices if a large time jitter on the trigger pulse relative to the desired regular sampling instance does not occur. Moreover, if there is a significant time jitter on the occurrence of the trigger pulse, but little or no systematic frequency error to remove, then the non-linear correction may be dispensed with. However, when both the timing jitter and the systematic frequency offset are significant, the non-linear correction method depicted in FIG. 4 may be desirable, as the magnitude of the non-linear effect is proportional to the product of the time error dT and the frequency offset dF.

The non-linear correction unit 40 of FIG. 4 includes an adder/subtractor 42 and a multiplier 44. A frequency estimator 46 is provided in order to produce frequency estimates and includes a comparator 47, an accumulator 48, and a loop filter 49.

In order to carry out the non-linear correction, an estimate of the frequency offset dF is needed for multiplication with dT, the sampling time error. FIG. 4 illustrates the use of the frequency estimator 46 in a method of estimating the instantaneous frequency error, and is otherwise referred to as a digital phase-lock loop. The frequency estimator 46 simultaneously estimates any static systematic frequency offset plus any dynamic, varying component, due for example, to modulation applied at the sending end of the input signal. Of course, if the static, systematic component is already known beforehand, as is the case when the digital accumulator 23 of FIG. 1 is used, it could be removed by such a digital accumulator technique before applying the result to the digital phase-lock loop of FIG. 4, which would then only estimate the residual dynamic component. The dynamic component would then be added to the static component to get the total instantaneous frequency error dF which is applied to the non-linear correction unit 40. If the dynamic component is small, and the static component is relatively large, it may be adequate to only use the static component for the value of dF in the non-linear correction. Since the digital phase-lock loop, however, estimates both the static and dynamic components of the instantaneous frequency offset, the digital accumulator 23 is not necessary in all situations.

The desired final result of the circuit illustrated in FIG. 4 is in fact a measure of the instantaneous deviation of the signal frequency from an already known nominal value. The digital phase-lock loop of the frequency estimator 46 produces a measure of the instantaneous deviation of the input signal 18 from the reference counter frequency, which is equal to the desired deviation from the nominal frequency plus the constant difference of the nominal frequency relative to the reference counter frequency. Therefore, the constant difference from the reference frequency, if not zero, would be subtracted from the frequency estimate dF before delivering the desired result to further processing. In this case, a constant value corresponding to the static frequency offset would have been subtracted from a frequency measurement, instead of, as in FIG. 1, subtracting an increasing phase correction from the phase measurement. If, however, a phase output value is desired from the system of FIG. 4, the corrected phase value from non-linear correction unit 40, if necessary, may be combined with the output of a digital accumulator as in FIG. 1 in order to subtract out the systematic offset caused by a known static frequency error.

Figure 5A:
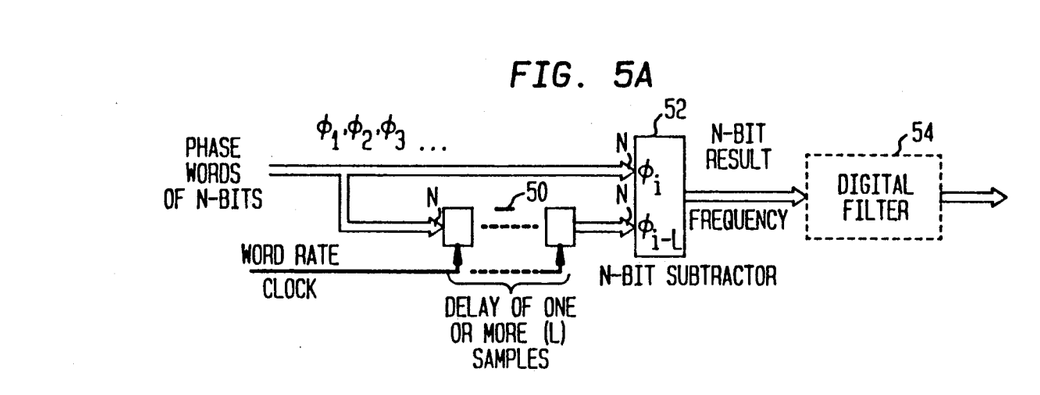
FIGS. 5a and 5b illustrate alternate embodiments of the frequency estimator according to the present invention.
Figure 5B:
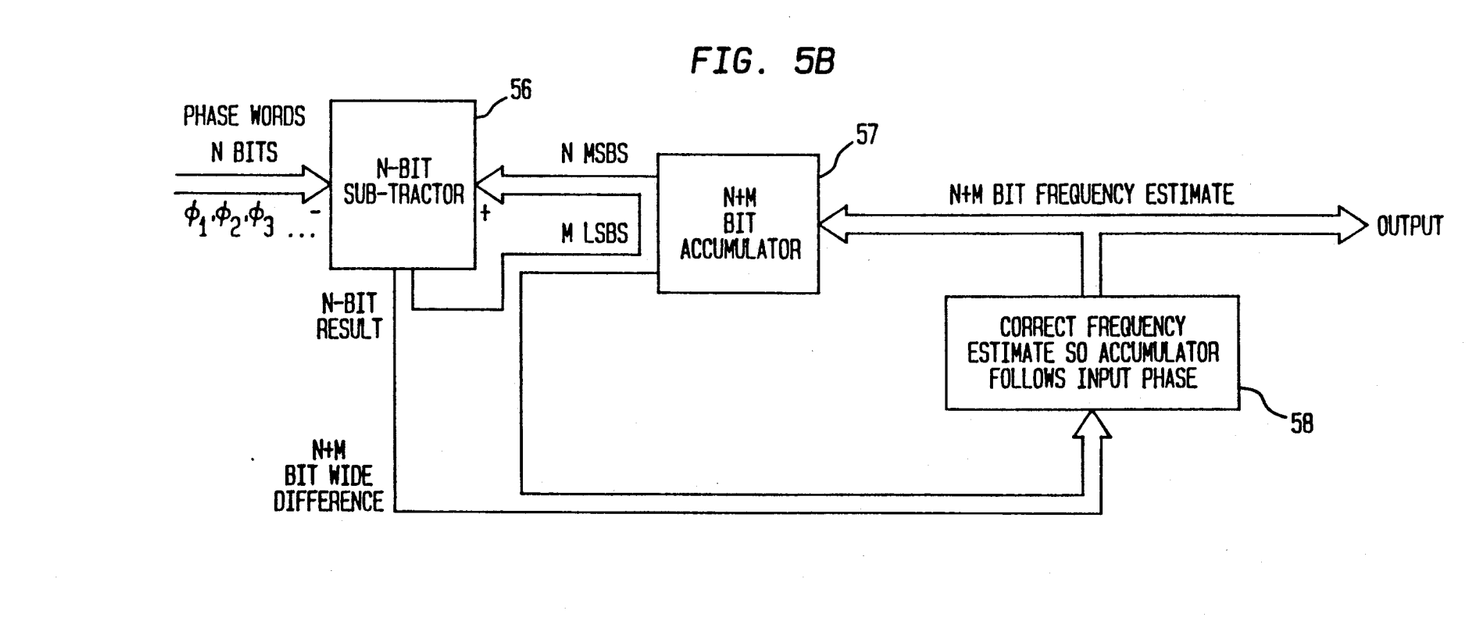

FIGS. 5a and 5b illustrate devices for deriving frequency estimates from resulting phase measurements, and each of the devices illustrated by FIGS. 5a and 5b may be used as an alternative embodiment for the frequency estimator 46 of FIG. 4.

FIG. 5a illustrates a device for deriving frequency estimates from phase measurements by numerically subtracting successive input samples. The device of FIG. 5a determines the rate of change of phase angles by subtracting adjacent phase angle measurements made one sample period apart. An n-bit subtractor 52 subtracts a delayed phase measurement $\phi_{i-L}$ from a current phase measurement $\phi_i$. The delayed phase measurement $\phi_{i-L}$ results from a phase measurement passing through delay units 50 which delay the phase measurement by a predetermined number of sampling periods. The end result is then passed through a digital filter 54 which in turn outputs the frequency estimate desired.

The device of FIG. 5b derives frequency estimates from phase measurements by utilizing a digital phase tracking loop circuit. The device subtracts, by way of n-bit subtractor 56, incoming samples of phase measurement values from a value contained in an accumulator 57. The accumulator 57 measures the angular error between the incoming phase samples and the stored value, and corrections are implemented by a correction unit 58 in order that the two values become aligned. The resulting alignment thus produces an estimate of the rotation frequency of the sequence of input phase angles. If the input frequency is constant, the output result will be accurate to the number of digits of the arithmetic used. If, however, the rate of rotation of the phase angles in the input sequence is not perfectly constant, e.g. noisy radio signals, the accumulator 57 and correction unit 58 will continually correct the error between the input sequence and values and the stored values. Thus, the resulting estimate will only be that of the input frequency at that particular moment.

While a particular embodiment of the present invention has been described and illustrated, it should be understood that the invention is not limited thereto since modifications may be made by persons skilled in the art. The present application contemplates any and all modifications that fall within the spirit and scope of the underlying invention disclosed and claimed herein.

What is claimed is:

1. An electrical circuit for determining at specified sampling instants a numerical value which represents as a digital code an instantaneous phase of an electrical signal relative to a reference frequency signal, said circuit comprising:

counter means for continuously generating a stored count representing a value resulting from dividing said reference frequency signal by a repeating count cycle frequency, said count cycle repetition frequency being of the same order as an expected center frequency of said electrical signal;

trigger means for producing a trigger pulse in response to receiving a sampling pulse and a transition of said electrical signal; and first register means for storing a momentary state of said counter means, said momentary state of said counter means being transferred to said first register means in response to said first register means receiving said trigger pulse, said momentary state corresponding to an instantaneous phase value of said electrical signal.

2. An electrical circuit according to claim 1 further comprising:

correcting means for correcting a resulting numerical value in said first register means by removing accumulating phase offset value, said phase offset value being a product of a predetermined time period between sampling pulses and a predetermined frequency difference between said count cycle repetition frequency and said expected center frequency of said electrical signal; and second register means for storing said corrected resulting numerical value of said counter means which is transferred from said first register means in response to an occurrence of a next sampling pulse, said occurrence of said next sampling pulse effecting a storage of a next momentary state of said counter means in said first register means.

3. An electrical circuit according to claim 2, wherein said trigger means comprises:

a first transition triggered device which is set in response to receiving said sampling pulse and producing a set signal; and a second transition triggered device which is set in response to receiving said transition of said electrical signal, and wherein said trigger pulse is produced by said second transition triggered device in response to said second transition triggered device receiving both said set signal from said first transition triggered device and said transition of said electrical signal, said trigger pulse effecting a reset of said first and second transition triggered devices.

4. An electrical circuit according to claim 3, wherein said first and second transition triggered devices comprise flip-flops.

5. An electrical circuit according to claim 3, further comprising:

second trigger means for producing a second trigger pulse in response to receiving said sampling pulse and a second transition of said electrical signal, said second transition being opposite to said transition of said electrical signal received at said second input of said trigger means;

third register means for storing said momentary state of said counter means, said momentary state of said counter means being transferred to said third register means in response to said third register means receiving said second trigger pulse; and means for combining contents of said first register means and said third register means in order to produce an output value.

6. An electrical circuit according to claim 2, wherein said correcting means comprises a digital accumulator having contents which are incremented between sampling pulses by a value which is proportional to said product of said predetermined time period and said predetermined frequency difference, said accumulator contents being added to or subtracted from said measured phase value in order to remove said accumulating phase offset.

7. An electrical circuit according to claim 2, further comprising means to produce a digital code which represents an instantaneous frequency of said electrical signal, said means to produce being operable for subtraction of two successive instantaneous phase values using modulo 2Pi arithmetic.

8. An electrical circuit according to claim 1, wherein said trigger means comprises:

a first trigger circuit for producing a first partial trigger pulse in response to receiving said sampling pulse and a positive going transition of said electrical signal;

a second trigger circuit for producing a second partial trigger pulse in response to receiving said sampling pulse and a negative going transition of said electrical signal an OR circuit for passing either of said first or second partial trigger pulses as said trigger pulse; and a flip-flop which produces a correction signal in response to said trigger pulse being produced in accordance with said second trigger circuit receiving said negative going transition of said electrical signal.

9. An electrical circuit according to claim 8, further comprising correcting means for correcting said momentary state of said counter means being stored in said first register means by 180° in response to receiving said correction signal.

10. An electrical circuit according to claim 9, wherein said correcting means comprises an XOR circuit for inverting the most significant bit of said momentary state.

11. An electrical circuit according to claim 2, further comprising a second correcting means coupled to said second register means for correcting said resulting numerical value for a timing error introduced by variations in said trigger pulse relative to said sampling pulse with a correction factor being proportional to a product of said timing error and an estimate of an instantaneous frequency value associated with said resulting numerical value.

12. An electrical circuit according to claim 11, further comprising a frequency estimator means coupled to said second correcting means for generating said instantaneous frequency value associated with said resulting numerical value.

13. An electrical circuit according to claim 12, wherein said frequency estimator means comprises a digital phase-lock-loop circuit.

14. An electrical circuit according to claim 12, wherein said frequency estimator means comprises a subtractor means for producing a difference between phase values occurring a predetermined number of sampling periods apart.

15. An electrical circuit according to claim 1, wherein said counter means produces a Grey coded counter sequence.

16. An electrical circuit according to claim 15, further comprising a Grey-to-binary converter coupled between said first register means and said second register means.

17. An electrical circuit for producing a digital value which is representative of an instantaneous phase of an input signal relative to a reference frequency, said circuit comprising:

a digital counter which continuously generates a stored count representing a value resulting from dividing said reference frequency by a repeating count cycle frequency;

a trigger circuit which produces a trigger pulse in response to being armed by a sampling pulse and being fired by a zero-crossing transition of said input signal; and a first storage latch for storing said value generated by said digital counter in response to receiving said trigger pulse, said stored value corresponding to an instantaneous phase value of said input signal.

18. An electrical circuit according to claim 17 further comprising:

a digital accumulator which is incremented at every occurrence of said sampling pulse by a predetermined phase error value, said phase error value being a product of a predetermined time period between sampling pulses and a predetermined frequency difference between said repeating count cycle frequency and an expected center frequency of said input signal;

a digital adder/subtractor which removes said phase error value from said stored value and produces a corrected phase value; and an output storage latch for storing said corrected phase value in response to an occurrence of a next sampling pulse.

19. An electrical circuit according to claim 17, wherein said first storage latch includes a dedicated bit for recording whether said reference frequency was on a negative or positive half cycle when said trigger pulse is produced.

20. An electrical circuit according to claim 17, wherein said trigger circuit comprises:

a first flip-flop which produces a set signal in response to receiving a high signal from a constant high signal source and said sampling pulse;

a second flip-flop which produces said trigger pulse in response to receiving said set signal and said zero-crossing transition of said input signal; and a delay circuit for producing a delayed reset pulse from said trigger pulse, said first and second flip-flops being simultaneously reset in response to receiving said delayed reset pulse.

21. An electrical circuit according to claim 17, further comprising:

a secondary trigger circuit which produces a second trigger pulse in response to receiving said sampling pulse and another zero-crossing transition of said input signal, said other zero-crossing transition being of opposite polarity to said zero-crossing transition of said input signal;

a second storage latch for storing another value of said counter circuit in response to receiving said second trigger pulse; and a combining circuit which combines contents of said first storage latch and said second storage latch to produce a phase representation value.

22. An electrical circuit according to claim 21, wherein said combining circuit combines the contents of said first and second storage latches by performing the following equation:

PRV=MOD2n(2A+MODn(B−A))

where n is an integer, A is the content of said first storage latch, B is the content of said second storage latch, and PRV is the phase representation value produced.

23. An electrical circuit according to claim 17, further comprising means to produce a digital code which represents an instantaneous frequency of said input signal, said means for producing being operable for subtraction of two successive instantaneous phase values of said input signal using modulo 2Pi arithmetic.

24. An electrical circuit according to claim 17, wherein said trigger circuit comprises:
a positive transition trigger circuit which produces a positive transition trigger pulse in response to receiving said sampling pulse and a positive going transition of said input signal;
a negative transition trigger circuit which produces a negative transition trigger pulse in response to receiving said sampling pulse and a negative going transition of said input signal;
an OR gate for passing either said positive transition trigger pulse or said negative transition trigger pulse as said trigger pulse;
a flip-flop which produces a correction signal in response to said trigger pulse being produced in accordance with said negative transition trigger circuit receiving said negative going transition of said electrical signal.

25. An electrical circuit according to claim 24, further comprising correcting means for correcting said stored value of said first storage latch by 180° in response to receiving said correction signal.

26. An electrical circuit according to claim 25, wherein said correcting means comprises an XOR gate for inverting the most significant bit of said stored value.

27. An electrical circuit according to claim 17, further comprising a second correcting means coupled to said output storage latch for correcting said phase value for a timing error introduced by variations in said trigger pulse relative to said sampling pulse with a correction factor, said correction factor being proportional to a product of said timing error and an estimate of an instantaneous frequency value associated with said phase value.

28. An electrical circuit according to claim 27, further comprising a frequency estimator means coupled to said second correcting means for generating said instantaneous frequency value associated with said phase value.

29. An electrical circuit according to claim 28, wherein said frequency estimator means comprises a digital phase-lock-loop circuit.

30. An electrical circuit according to claim 28, wherein said frequency estimator means comprises a subtractor means for producing a difference between phase values occurring a predetermined number of sampling periods apart.

31. An electrical circuit according to claim 17, wherein said counter means produces a Grey coded counter sequence.

32. An electrical circuit according to claim 31, further comprising a Grey-to-binary converter coupled between said intermediate latch and said output latch.

33. A method for producing a digital value which is representative of an instantaneous phase of an input signal relative to a reference frequency, comprising the steps of:
continuously generating a stored count representing a value resulting from dividing said reference frequency by a repeating count cycle frequency;
producing a trigger pulse in response to an occurrence of a sampling pulse and a zero-crossing transition of said input signal; and
storing said value generated in response to receiving said trigger pulse, said stored value of said input signal.

34. A method according to claim 33 further comprising the steps of:
incrementing a digital accumulator at every occurrence of said sampling pulse by a predetermined phase error value, said phase error value being a product of a predetermined time period between sampling pulses and a predetermined frequency difference between said repeating count cycle frequency and an expected center frequency of said input signal;
removing said phase error value from said stored value and producing a corrected phase value; and
storing said corrected phase value in response to an occurrence of a next sampling pulse.

35. A method according to claim 33 further comprising the step of recording whether said reference frequency was on a negative or positive half cycle when said trigger pulse is produced.

36. A method according to claim 33 further comprising the steps of:
producing a second trigger pulse in response to receiving said sampling pulse and another zero-crossing transition of said input signal, said other zero-crossing transition being of opposite polarity to said zero-crossing transition of said input signal;
storing another value generated in response to receiving said second trigger pulse; and
combining contents being stored to produce a phase representation value.

37. A method according to claim 36 wherein said step of combining said contents being stored further comprises the step of performing the following equation:

PRV=MOD2n (2A+MODn(B−A))

where n is an integer, A is the value stored in response to said trigger pulse, B is the value stored in response to said second trigger pulse, and PRV is the phase representation value produced.

38. A method according to claim 33 further comprising the step of producing a digital code which represents an instantaneous frequency of said input signal, said producing step including subtracting two successive instantaneous phase values of said input signal using modulo 2Pi arithmetic.

39. A method according to claim 34 further comprising the step of correcting said phase value for a timing error introduced by variations in said trigger pulse relative to said sampling pulse with a correction factor, said correction factor being proportional to a product of said timing error and an estimate of an instantaneous frequency value associated with said phase value.

40. A method according to claim 39 further comprising the step of generating an estimate of said instantaneous frequency value associated with said phase value.

41. A method according to claim 40 wherein said generating step further includes the step of producing a difference between phase values occurring a predetermined number of sampling periods apart.

* * * * *